United States Patent [19]

Schneider et al.

[11] Patent Number: 5,571,340
[45] Date of Patent: Nov. 5, 1996

[54] ROSIN-FREE, LOW VOC, NO-CLEAN SOLDERING FLUX AND METHOD USING THE SAME

[75] Inventors: Alvin F. Schneider, Warren, N.J.; David B. Blumel, New York, N.Y.; Jack Brous, Livingston, N.J.

[73] Assignee: Fry's Metals, Inc., Providence, R.I.

[21] Appl. No.: 303,668

[22] Filed: Sep. 9, 1994

[51] Int. Cl.$^6$ ........................................ B23K 35/34
[52] U.S. Cl. .................................. 148/23; 148/24
[58] Field of Search ................................ 148/23, 24

[56] References Cited

U.S. PATENT DOCUMENTS

| | | | |
|---|---|---|---|
| 2,470,957 | 5/1949 | Strader | 148/23 |
| 3,099,590 | 2/1963 | Laudenslager | 148/23 |
| 3,746,620 | 7/1973 | Vance | 148/23 |
| 3,840,411 | 11/1974 | Rozzi | 148/23 |
| 3,925,112 | 12/1975 | Peterson, Sr. et al. | 148/25 |
| 4,000,016 | 12/1976 | Lazzarini et al. | 148/23 |
| 4,077,815 | 3/1978 | Schuessler | 148/23 |
| 4,098,621 | 7/1978 | Strauss et al. | 148/23 |
| 4,113,524 | 9/1978 | Katz | 148/23 |
| 4,140,554 | 2/1979 | Stayner et al. | 148/23 |
| 4,151,015 | 4/1979 | Cooper | 148/23 |
| 4,568,395 | 2/1986 | Nabhani | 148/23 |
| 4,601,763 | 7/1986 | Stratil et al. | 148/23 |
| 4,661,173 | 4/1987 | Barajas et al. | 148/24 |
| 4,708,751 | 11/1987 | Froebel et al. | 148/23 |
| 4,759,490 | 7/1988 | Ochiai | 228/124 |
| 4,895,606 | 1/1990 | Jafri | 148/25 |
| 4,940,498 | 7/1990 | Rubin | 148/23 |
| 4,988,395 | 1/1991 | Taguchi et al. | 148/24 |
| 4,994,119 | 2/1991 | Gutierrez et al. | 148/23 |
| 5,004,509 | 4/1991 | Bristol | 148/23 |
| 5,009,724 | 4/1991 | Dodd et al. | 148/23 |
| 5,069,730 | 12/1991 | Dodd et al. | 148/23 |
| 5,085,365 | 2/1992 | Turner | 228/223 |
| 5,131,962 | 7/1992 | Minahara et al. | 148/23 |
| 5,141,568 | 8/1992 | Turner et al. | 148/24 |
| 5,145,531 | 9/1992 | Turner et al. | 148/23 |
| 5,281,281 | 1/1994 | Stefanowski | 148/23 |
| 5,297,721 | 3/1994 | Schnieder et al. | 228/180.1 |

FOREIGN PATENT DOCUMENTS

| | | |
|---|---|---|
| 0077622 | 4/1983 | European Pat. Off. . |
| 49-26826 | 7/1974 | Japan . |
| 49-26825 | 7/1974 | Japan . |
| 62-6796 | 1/1987 | Japan . |
| WO80/02663 | 2/1980 | WIPO . |

*Primary Examiner*—Sam Silverberg
*Attorney, Agent, or Firm*—Shapiro and Shapiro

[57] ABSTRACT

A rosin-free, low VOC, no-clean soldering flux consists essentially of one or more halide-free carboxylic acid activators in an aggregate amount not exceeding about 8% by weight of the flux; one or more alkyl amines capable of forming amine salt of the one or more activators and in an aggregate amount not exceeding about 10% by weight of the flux; and water, with or without a surfactant. The flux is particularly useful in a method of producing soldered printed wiring assemblies with minimal residual ionic contamination, so that post-soldering cleaning of the assemblies is unnecessary.

22 Claims, No Drawings

ROSIN-FREE, LOW VOC, NO-CLEAN SOLDERING FLUX AND METHOD USING THE SAME

BACKGROUND OF THE INVENTION

This invention relates to soldering fluxes and methods of use. The invention is more particularly concerned with a rosin-free, low VOC (volatile organic compound), no-clean soldering flux and with a method using the soldering flux to produce soldered printed wiring assemblies.

The present invention represents a further development from the invention described in commonly assigned U.S. Pat. No. 5,297,721 issued Mar. 29, 1994, incorporated herein by reference. Among other things, the earlier-patented invention provides a rosin-free, substantially VOC-free flux based on the use of a halide-free, water soluble activator in combination with a fluorinated surfactant and water. The preferred activators include carboxylic acids, such as glutaric acid and succinic acid, having solubilities in water of at least 5 grams per 100 cc at 20° C. The flux is described principally for spray application to printed wiring assemblies preparatory to wave soldering, a commonly used soldering technique in which surfaces of a printed wiring (printed circuit board) and of component leads and terminations to be soldered thereto are subjected to a solder wave which passes along the board and components mounted thereon. The flux is applied to the assemblies in controlled amounts consistent with the attainment of an effective fluxing action with minimal post-soldering flux residue. This ensures minimal residual ionic contamination of the soldered assemblies so that post-soldering cleaning of the assemblies is unnecessary.

The earlier-patented flux has been found to provide excellent results under standard surface insulation resistance testing procedures for printed wiring assemblies, such as IPC and Bellcore procedures, as well as under standard corrosion resistance testing procedures, such as copper mirror and silver chromate paper tests.

Certain electronics manufacturers, however, utilize flux qualification test procedures which go beyond the generally accepted standards. These more rigorous procedures may involve, for example, the application of excessive amounts of flux to test boards, testing with no soldering, or testing with soldering but only minimal preheating of test boards. For the purposes of these testing procedures, we have found it desirable to provide a flux which can be formulated to achieve an even more benign residue than the preferred formulations of the earlier-patented flux.

The present invention has been devised in view of the foregoing.

SUMMARY OF THE INVENTION

While the earlier-patented flux sought substantially completely to avoid the use of VOC's, the flux of the present invention advantageously includes a minor amount of volatile alkyl amine. As will be explained herein, through the use of the alkyl amine, the present invention can achieve a more benign flux residue than the preferred compositions of the earlier-patented flux, while, to a large degree, retaining the benefits of the substantially VOC-free characteristic of such compositions.

Broadly speaking, the present invention provides a rosin-free (more generally, resin free), low VOC, no-clean soldering flux which is based on the use of halide-free carboxylic acid activator in combination with alkyl amine, capable of forming amine salt of the activator, and water. The presence of an alkyl amine in accordance with this invention enables the use of activators which have a relatively low solubility in water as compared with the preferred activators of the earlier-patented flux, and which are thus more weakly ionized. More particularly, by virtue of its salt forming capability, the alkyl amine is effective to enhance the solubility of the activator in water, thereby ensuring that the activator is brought fully into solution. Alkyl amines may also contribute a mild fluxing effect, thereby enhancing the overall fluxing action of the composition.

Through the use of less aggressive (more weakly ionic) carboxylic acids than those preferred in the earlier-patented flux, the flux of the present invention can achieve a more benign residue which provides a higher surface insulation resistance and an improved non-corrosive property. In addition, the flux of the invention can be formulated more suitably for application to printed wiring assemblies by conventional foam fluxing, in which flux application rates cannot be controlled as precisely as with spray fluxing. Spray, wave, and other fluxing techniques may also be used, however. Notably, the amine is also effective to maintain the activator in solution throughout repeated freeze/thaw cycling of the flux. This is particularly advantageous from the standpoint of transportation and storage.

Depending upon the intended mode of application and the desired properties, the flux of the present invention may or may not contain a surfactant.

Thus, in accordance with one of its principal aspects, the present invention provides a low VOC, no-clean soldering flux which is rosin-free and which consists essentially of one or more halide-free carboxylic acid activators in an aggregate amount not exceeding about 8% by weight of the flux; one or more alkyl amines capable of forming amine salt with the one or more activators, in an aggregate amount not exceeding about 10% by weight of the flux; and water, with or without a surfactant.

According to another of its principal aspects, the invention provides a method of producing soldered printed wiring assemblies without the need for post-soldering cleaning, comprising the steps of applying a soldering flux as described above to the assemblies, preheating the fluxed assemblies to volatilize water and amine from the flux, and wave soldering the assemblies.

The foregoing and additional aspects of the present invention, as well as its many advantages, will be more fully appreciated from the detailed description which follows.

DETAILED DESCRIPTION OF THE INVENTION

The rosin-free soldering flux of the present invention includes, as principal ingredients, one or more carboxylic acid activators, one or more alkyl amines capable of forming amine salt of the activator(s), and water—preferably deionized. As will later be explained, the flux may also include a surfactant as a principal ingredient, depending, for example, on whether it is to be spray or foam applied.

The flux of the invention is easily prepared by adding appropriate proportions of the activator(s), the amine(s), and any surfactant to the water at room temperature, and mixing to form an aqueous solution. It is compatible with solders normally used in the wave soldering of printed wiring assemblies and with the metals normally soldered in such processes. Examples of such solders and metals are given in the earlier-referenced patent.

The total activator content of the flux should be between about 0.25% and about 8% by weight of the flux. Lower activator content may not provide sufficient fluxing activity, while a higher activator content may result in excessive residues which could adversely affect the finished soldered assembly, which is not intended to be cleaned. As between stronger and weaker activators, stronger activators should ordinarily be used in amounts more toward the lower end of the indicated range, whereas weaker activators are better suited for use in amounts more toward the higher end of the range. The preferred activator content is from about 0.5% to about 5% by weight of the flux. In order to obtain optimal benefit of the invention, it is preferred to use activators which have a solubility in water of less than 5 grams per 100 cc at 20° C. Adipic acid has been found to provide excellent results and is especially preferred.

The following are examples of activators suitable for use in the present invention. All have solubility in water less than 5 grams per 100 cc at 20° C.

Monocarboxylic Acid

Valeric acid
Trimethylacetic acid
Caproic acid
Enanthic acid
Cyclohexane carboxylic acid
Benzoic acid
Caprylic acid
Phenylacetic acid
Pelargonic acid
Sorbic acid
Capric acid
Undecanoic acid
Lauric acid
Tridecanoic acid
Myristic acid
Pentadecanoic acid
Palmitic acid
Margaric acid
Stearic acid
Cinnamic acid
Hippuric acid
Carboxybenzotriazole Dicarboxylic Acid Adipic acid
Pimelic acid
Suberic acid
Azelaic acid
Sebacic acid
Undecanedicarboxylic acid
Dodecanedicarboxylic acid
Tridecanedicarboxylic acid
Tetradecanedicarboxylic acid
Fumaric acid
1,2,3,6-tetrahydrophthalic acid
3,4,5,6-tetrahydrophthalic acid
trans-glutaconic acid
1,2-cyclohexane dicarboxylic acid
1,3-cyclohexane dicarboxylic acid
1,4-cyclohexane dicarboxylic acid
Phenylsuccinic acid
5-tert-butyl-1,3-benzenedicarboxylic acid
2,6-naphthalene dicarboxylic acid
1,1,3-trimethyl-3-phenylindan-4',5-dicarboxylic acid Tricarboxylic Acid 1,3,5-benzenetricarboxylic acid Hydroxycarboxylic Acids Benzilic acid
Gallic acid
2,6-dihydroxybenzoic acid
Hydroxybenzoic acid
Vanillic acid
Salicyloylsalicylic acid The total alkyl amine content of the flux should be sufficient to ensure that the entire amount of activator present will be solubilized in the water. Preferably, the amine content will be between about 0.1% and about 10% by weight of the flux—and, more preferably, from about 0.1% to about 5% by weight of the flux. It is also preferable that the alkyl amine be volatilized at a relatively low temperature (e.g., boiling point below 100° C), so that it will not remain in significant amounts after completion of the soldering process. Triethylamine has been found to provide excellent results and is especially preferred.

The following are examples of alkyl amines suitable for practice of the invention, all having boiling points of 100° C or below.

Alkyl Amines

Methylamine
Dimethylamine
Trimethylamine
Ethylamine
Diethylamine
Triethylamine
n-Propylamine
Di-n-Propylamine
Tri-n-Propylamine
Isopropylamine
Diisopropylamine
Triisopropylamine
Butylamine
Di-n-butylamine
Tri-n-butylamine
Ethyl-n-butylamine
Amylamine
Diamylamine
Triamylamine
sec-Butylamine
Cyclohexylamine
n-Hexylamine
Di-n-hexylamine Tri-n-hexylamine As previously mentioned, the flux of this invention can be formulated for application to printed wiring assemblies by conventional foam fluxing, as well as by spray, wave, and other fluxing methods. Spray fluxing allows for more precise control of the flux application rate than foam and wave fluxing, for example, and may be preferred in order to minimize post-soldering flux residues on the finished soldered assemblies, which are not intended to be cleaned. The flux application rate is preferably determined such that the amount of flux "solids" (more precisely, non-volatiles) remaining on the printed wiring assembly after drying is in the range of from about 200 micrograms to about 1,500 micrograms per square inch (from about 31 micrograms to about 233 micrograms per square centimeter) of board area, and more preferably in the range from about 400 micrograms to about 1,200 micrograms per square inch (from about 62 micrograms to about 186 micrograms per square centimeter) of board area. This will assure sufficient wetting by the flux of the surfaces to be wave soldered and good solder joints, as well as assuring minimal residual ionic contamination and good (high) surface insulation resistance of the soldered assembly—with no post-soldering cleaning.

Depending primarily on the intended mode of application, the flux of the invention may include a surfactant or mixture of surfactants. Nonionic, anionic, cationic, amphoteric and fluorinated surfactants can be used, for example, to an extent consistent with maintaining good surface insulation resistance of the finished soldered assemblies. Formulations for spray application ordinarily will include one or more surfactants to enhance the wetting properties of the flux in order to ensure thorough coverage with minimal spraying of the surfaces being soldered. Formulations for foam application may include surfactant to control the foaming properties of the flux. Stronger surfactants, such as fluorosurfactants, are better suited for spray formulations, and should ordinarily be avoided with foam formulations because they tend to produce foams which are too stable for effective flux application (foam bubbles tend not to break as necessary).

When a surfactant or mixture of surfactants is used, it is preferred that the total surfactant content be less than about 1.0% by weight of the flux, and more preferably, that the surfactant content range from about 0.01% to about 0.1% by weight of the flux. Satisfactory results can also be achieved with formulations containing no surfactant.

The flux of the invention may contain various additional ingredients in minor amounts which do not materially affect its basic properties. Such ingredients include, for example, corrosion inhibitors such as benzotriazole substituted benzotriazoles (e.g., hydroxybenzotriazole), imidazoles, and substituted imidazoles; stabilizers; and biocides. They may be added in an aggregate amount preferably not exceeding about 0.1% by weight of the flux. The use of such ingredients is well understood by those skilled in the art and need not be addressed in further detail.

It should be noted that certain ingredients of the flux may be supplied by the manufacturer in a carrier containing an organic solvent (VOC) such as isopropanol. For example, the DuPont Zonyl FSN fluoro-surfactant appearing in a number of the specific examples hereinafter is supplied as a 40% concentration of active (surfactant) in 30% each of water and isopropyl alcohol. Of course, because such ingredients are used in only small concentrations, the resulting increase in the VOC content of the flux is insignificant.

Preferred Embodiments

The following are specific examples illustrating preferred compositions in accordance with the present invention. In each example, the flux was prepared by dissolving the activator, the alkyl amine, and the additional ingredients in deionized (DI) water at room temperature and stirring to yield a homogeneous aqueous solution. All of the ingredients listed in the examples are readily available commercially and were used without modification. The acid activator and the alkyl amine were in commercially pure form (substantially 100% purity). Examples 1 and 2 include surfactant and are especially suited for spray application. Example 2 also contains a corrosion inhibitor to provide enhanced copper corrosion protection. Examples 3 and 4 contain no surfactant and are especially suited for foam application. Example 4 also contains a corrosion inhibitor. All of Examples 1–4 contain a biocide. Ingredients listed by manufacturer's designation are described in Table 1 appearing hereinafter.

|  | % by Wt. |
|---|---|
| Example 1: | |
| DI Water | 96.33 |
| Triethylamine | 1.38 |
| Adipic Acid | 2.00 |
| Triton N-101 | 0.03 |
| Surfadone LP-100 | 0.06 |
| Ucarcide 250 | 0.20 |
|  | 100.00% |
| Example 2: | |
| DI Water | 96.19 |
| Triethylamine | 1.38 |
| Adipic Acid | 2.00 |
| Triton N-101 | 0.03 |
| Ucarcide 250 | 0.20 |
| Benzotriazole | 0.20 |
|  | 100.00% |
| Example 3: | |
| DI Water | 96.42 |
| Triethylamine | 1.38 |
| Adipic Acid | 2.00 |
| Ucarcide 250 | 0.20 |
|  | 100.00% |
| Example 4: | |
| DI Water | 96.32 |
| Triethylamine | 1.38 |
| Adipic Acid | 2.00 |
| Ucarcide 250 | 0.20 |
| Benzotriazole | 0.10 |
|  | 100.00% |

The fluxes of Examples 1–4 all passed the standard copper mirror corrosion test. In addition, the fluxes of Examples 2 and 4, which include added corrosion inhibitor as noted above, passed the IPC copper corrosion test. All of the fluxes were subjected to freeze/thaw testing, exhibiting no precipitation or separation when allowed to re-warm to room temperature (20°–25° C.).

In a further test of the flux of Example 1, 200 μl of flux (five times the normal rate) was syringe-applied along the test pattern of each of three standard Bellcore FR4 glass epoxy test boards (50 mm test pattern spacing). The boards were then wave soldered, test pattern side up ("comb up"), with 63/37 Sn/Pb solder on a Hollis Future 1 SMT wave soldering machine. The preheat temperature was set to 105° C. (board topside), the solder pot temperature to 260° C., and the conveyor speed to 1.52 meters/min.

After 7 days at 35° C. and 85% relative humidity, the surface insulation resistance (SIR) was measured at four locations on each board. The geometric mean SIR reading for the three boards was $1.6 \times 10^{11}$ ohms, and there was no corrosion on the copper traces of the boards-thus indicating a very low level of residual ionic contamination and confirming the highly benign, non-corrosive characteristic of the flux residue.

For purposes of comparison, a flux according to the earlier-patented invention was similarly tested. The comparative flux included substantially the same amount of activator, but utilized more highly water-soluble carboxylic acid as previously described. The comparative flux produced a geometric mean SIR reading of $1.7 \times 10^{8}$ ohms, with visible corrosion on the copper traces of the test boards.

As a further test of the flux of Example 3, 20 drops (about 1 ml) of flux were applied with approximately equal spacing to each of three test boards of the type previously described. This was equivalent to an application rate of about 25 mg gross flux per square centimeter of board area, or about 0.5 mg flux solids per square centimeter of board area. The test boards were then drained in a vertical position and allowed to air dry at room temperature, i.e., no preheating and no soldering. After 1 day at 40° C. and 93% relative humidity, SIR measurements were conducted as described above, and a geometric mean SIR reading of $4.15 \times 10^{9}$ ohms was obtained.

For purposes of comparison, a flux according to the earlier-patented invention was similarly tested. The comparative flux included substantially the same amount of activator, but utilized more highly water-soluble carboxylic acid as previously described. The comparative flux produced a geometric mean SIR reading of $9.1 \times 10^{6}$ ohms.

Additional Examples

The following are examples of additional formulations in accordance with the present invention.

| | % by Wt. |
|---|---|
| Example 5: | |
| DI Water | 99.27 |
| Adipic Acid | 0.50 |
| Triethylamine | 0.10 |
| Triton X-100 | 0.03 |
| Benzotriazole | 0.05 |
| Ucarcide 250 | 0.05 |
| | 100.00 |
| Example 6: | |
| DI Water | 96.36 |
| Adipic Acid | 1.00 |
| Suberic Acid | 1.00 |
| Diisopropylamine | 1.38 |
| Imidazole | 0.10 |
| Zonyl FSN | 0.06 |
| Troysan 192 | 0.10 |
| | 100.00 |
| Example 7: | |
| DI Water | 94.62 |
| Adipic Acid | 1.50 |
| Palmitic Acid | 0.50 |
| Triethylamine | 3.33 |
| Troysan 192 | 0.05 |
| | 100.00 |
| Example 8: | |
| DI Water | 95.85 |
| Adipic Acid | 1.25 |
| Sebacic Acid | 0.75 |
| Tri-n-propylamine | 2.00 |
| Dantogard | 0.10 |
| Fluorad FC-430 | 0.05 |
| | 100.00 |
| Example 9: | |
| DI Water | 91.20 |
| Adipic Acid | 5.00 |
| Triethylamine | 3.50 |
| Troysan 192 | 0.20 |
| Triton X-100 | 0.10 |
| | 100.00 |
| Example 10: | |
| DI Water | 96.30 |
| Phenylsuccinic Acid | 2.00 |
| Triethylamine | 1.50 |
| Zonyl FSN | 0.10 |
| Dantogard | 0.10 |
| | 100.00 |
| Example 11: | |
| DI Water | 95.86 |
| Suberic Acid | 1.10 |
| Pimelic Acid | 0.90 |
| Diisopropylamine | 1.70 |
| Hydroxybenzotriazole | 0.20 |
| Ucarcide 250 | 0.20 |
| Triton X-100 | 0.04 |
| | 100.00 |
| Example 12: | |
| DI Water | 94.60 |
| Adipic Acid | 1.30 |
| Mandelic Acid | 0.20 |
| Stearic Acid | 0.50 |
| Ethyl-n-butylamine | 3.30 |
| Troysan 192 | 0.10 |
| | 100.00 |
| Example 13: | |
| DI Water | 85.70 |
| Suberic Acid | 8.00 |
| Triethylamine | 6.00 |
| Troysan 192 | 0.20 |
| Zonyl FSN | 0.10 |
| | 100.00 |
| Example 14: | |
| DI Water | 99.57 |
| Adipic Acid | 0.25 |
| Butylamine | 0.10 |
| Dantogard | 0.05 |
| Triton X-100 | 0.03 |
| | 100.00 |
| Example 15: | |
| DI Water | 83.75 |
| Sebacic Acid | 6.00 |
| Tri-n-hexylamine | 10.00 |
| Ucarcide 250 | 0.20 |
| Fluorad FC-430 | 0.05 |
| | 100.00 |

-continued

|  | % by Wt. |
|---|---|
| Example 16: | |
| DI Water | 91.75 |
| Azelaic Acid | 3.00 |
| Diamylamine | 5.00 |
| Troysan 192 | 0.20 |
| Fluorad FC-430 | 0.05 |
|  | 100.00 |
| Example 17: | |
| DI Water | 95.25 |
| Pimelic Acid | 2.00 |
| Diethylamine | 1.55 |
| Dantogard | 0.20 |
| Triton X-100 | 1.00 |
|  | 100.00 |
| Example 18: | |
| DI Water | 96.39 |
| Adipic Acid | 2.00 |
| Triethylamine | 1.40 |
| Triton X-100 | 0.01 |
| Ucarcide 250 | 0.20 |
|  | 100.00 |
| Example 19: | |
| DI Water | 95.90 |
| Suberic Acid | 2.00 |
| Tri-n-propylamine | 1.00 |
| Diisopropylamine | 1.00 |
| Zonyl FSN | 0.05 |
| Troysan 192 | 0.05 |
|  | 100.00 |

TABLE I

Dantogard, Biocide (Dimethylol-5, 5-dimethylhydantoin), Lonza Specialty Chemicals Fluorad FC-430, Nonionic Surfactant (Fluoroaliphatic polymeric ester, ≈ 100%), 3M Surfadone LP-100 Nonionic Surfactant (n-octyl-2-pyrrolidone, 98%), ISP. Technologies, Inc.

Triton N-101, Nonionic Surfactant (nonylphenyl ethoxylate, ≈ 100%), Union Carbide Triton X-100, Nonionic Surfactant (octylphenyl ethoxylate ≈ 100%), Union Carbide Troysan 192, Biocide (2 (hydroxymethyl) amino-2-methylpropanol), Troy Chemical Corp.

Ucarcide 250, Biocide, (Glutaraldehyde), Union Carbide

Zonyl FSN, Nonionic Surfactant (perfluoroalkyl ethoxylate, 40% in isopropyl alcohol/water 30%/30%), DuPont While the present invention has been described with respect to its preferred implementation, it will be apparent to those skilled in the art that various changes can be made in keeping with the principles and spirit of the invention, the scope of which is defined in the appended claims.

We claim as our invention:

1. A low VOC, no-clean soldering flux which is rosin-free and which consists essentially of:
   one or more halide-free carboxylic acid activators in an aggregate amount not exceeding about 8% by weight of the flux, each activator having a solubility in water less than 5 grams per 100 cc at 20° C.;
   one or more alkyl amines capable of forming amine salt of said one or more activators and in an aggregate amount not exceeding about 10% by weight of the flux; and
   water, with or without a surfactant.

2. A soldering flux according to claim 1, wherein said one or more activators include adipic acid.

3. A soldering flux according to claim 1, containing only one said activator, said one activator being adipic acid.

4. A soldering flux according to claim 3, containing only one said amine, said one amine being triethylamine.

5. A soldering flux according to claim 1, wherein said one or more amines include triethylamine.

6. A soldering flux according to claim 1, containing only one said amine, said one amine being triethylamine.

7. A soldering flux according to claim 1, wherein the total activator content is at least about 0.25% by weight of the flux.

8. A soldering flux according to claim 7, wherein the total activator content is from about 0.5% to about 5.0% by weight of the flux.

9. A soldering flux according to claim 8, wherein the total amine content is from about 0.1% to about 5.0% by weight of the flux.

10. A soldering flux according to claim 1, wherein the total amine content is at least about 0.1% by weight of the flux.

11. A soldering flux according to claim 1, wherein the total amine content is from about 0.1% to about 5.0% by weight of the flux.

12. A soldering flux according to claim 1, wherein a surfactant is present in an amount not exceeding about 1.0% by weight of the flux.

13. A soldering flux according to claim 12, wherein the amount of surfactant is from about 0.01% to about 0.1% by weight of the flux.

14. A method of producing soldered printed wiring assemblies without the need for post-soldering cleaning, comprising:
   applying to the assemblies a low VOC, no-clean soldering flux which is rosin-free and which consists essentially of one or more halide-free carboxylic acid activators in an aggregate amount not exceeding about 8% by weight of the flux, each activator having a solubility in water less than 5 grams per 100 cc at 20° C.; one or more alkyl amines capable of forming amine salt of said one or more activators, in an aggregate amount not exceeding about 10% by weight of the flux; and water, with or without a surfactant;
   preheating the fluxed assemblies to volatilize water and amine from the flux; and
   wave soldering the assemblies.

15. A method according to claim 14, wherein the total activator content of the flux is from about 0.5% to about 5.0% by weight of the flux.

16. A method according to claim 14, wherein the total amine content of the flux is from about 0.1% to about 5.0% by weight of the flux.

17. A method according to claim 14, wherein said one or more activators of the flux include adipic acid.

18. A method according to claim 14, wherein said one or more amines of the flux include triethylamine.

19. A method according to claim 14, wherein the flux does not contain a surfactant and is applied to the assemblies by foam fluxing.

20. A method according to claim 14, wherein the flux contains a surfactant and is applied to the assemblies by spray or wave fluxing.

21. A method according to claim 14, wherein the flux is applied to the assemblies at an application rate such that the flux solids remaining on the assemblies after the water and amine are volatilized is in the range of from about 200 to about 1500 μ per square inch of board area of the assemblies.

22. A method of producing soldered printed wiring assemblies without the need for post-soldering cleaning, comprising:

applying to the assemblies a low VOC, no-clean soldering flux which is rosin-free and which consists essentially of one or more halide-free carboxylic acid activators in an aggregate amount not exceeding about 8% by weight of the flux, each activator having a solubility in water less than 5 grams per 100 cc at 20° C.; one or more alkyl amines capable of forming amine salt of said one or more activators, in an aggregate amount not exceeding about 10% by weight of the flux; and water, with or without a surfactant; and soldering the assemblies.

* * * * *